(12) United States Patent
Wang et al.

(10) Patent No.: US 10,984,724 B2
(45) Date of Patent: Apr. 20, 2021

(54) PIXEL COMPENSATION CIRCUIT AND OLED DISPLAY DEVICE

(71) Applicant: Wuhan China Star Optoelectronics Semiconductor Display Technology Co., Ltd., Wuhan (CN)

(72) Inventors: Wei Wang, Wuhan (CN); Pinquan Xu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/603,857

(22) PCT Filed: Jul. 8, 2019

(86) PCT No.: PCT/CN2019/095073
§ 371 (c)(1),
(2) Date: Oct. 9, 2019

(87) PCT Pub. No.: WO2020/228118
PCT Pub. Date: Nov. 19, 2020

(65) Prior Publication Data
US 2020/0365089 A1    Nov. 19, 2020

(51) Int. Cl.
*G09G 3/3266* (2016.01)
*G09G 3/3258* (2016.01)
(Continued)

(52) U.S. Cl.
CPC ......... *G09G 3/3266* (2013.01); *G09G 3/3258* (2013.01); *G09G 3/3275* (2013.01); *H01L 27/3262* (2013.01); *H01L 27/3265* (2013.01); *H01L 27/3276* (2013.01); *G09G 2300/0465* (2013.01)

(58) Field of Classification Search
CPC .. G09G 3/3266; G09G 3/3258; G09G 3/3275; G09G 2300/0465; H01L 27/3262; H01L 27/3265; H01L 27/3276
See application file for complete search history.

(56) References Cited

U.S. PATENT DOCUMENTS 7,629,743 B2    12/2009   Murakami et al.
2015/0296162 A1   10/2015   Kurokawa et al.
(Continued)

FOREIGN PATENT DOCUMENTS

CN    106165397    11/2016
CN    108538251    9/2018
(Continued)

*Primary Examiner* — Wing H Chow (57) ABSTRACT

A pixel compensation circuit and an OLED display device are disclosed. Two or more TFTs are controlled by the scanning signal output from the scanning signal line in the same row in the pixel compensation circuit proposed by the present disclosure. Further, the OLED and the storage capacitor are both connected to the reset voltage signal line. So the OLED and the storage capacitor are reset after receiving the reset voltage signal. The size of the pixel structure in the horizontal direction is compressed in the pixel compensation circuit of the present disclosure, thereby providing space for the improvement of the PPI and facilitating the design of the high PPI panel successfully.

16 Claims, 3 Drawing Sheets

(51) Int. Cl.
  *G09G 3/3275* (2016.01)
  *H01L 27/32* (2006.01)

(56) References Cited

U.S. PATENT DOCUMENTS

| | | |
|---|---|---|
| 2015/0325633 A1 | 11/2015 | Yamazaki et al. |
| 2017/0264848 A1 | 9/2017 | Kurokawa et al. |
| 2018/0151118 A1* | 5/2018 | Chung ................. G09G 3/3233 |
| 2019/0156744 A1 | 5/2019 | Song et al. |
| 2019/0197950 A1* | 6/2019 | Shibusawa ........... G09G 3/3266 |

FOREIGN PATENT DOCUMENTS

| | | |
|---|---|---|
| CN | 109003579 | 12/2018 |
| CN | 109064977 | 12/2018 |
| CN | 109527287 | 3/2019 |

* cited by examiner

PIXEL COMPENSATION CIRCUIT AND OLED DISPLAY DEVICE

RELATED APPLICATIONS

This application is a National Phase of PCT Patent Application No. PCT/CN2019/095073 having International filing date of Jul. 8, 2019, which claims the benefit of priority of Chinese Patent Application No. 201910396424.7 filed on May 14, 2019. The contents of the above applications are all incorporated by reference as if fully set forth herein in their entirety.

FIELD AND BACKGROUND OF THE INVENTION

The present disclosure relates to the field of display, and more particularly, to a pixel compensation circuit and an organic light-emitting diode (OLED) display device.

The rapid development of organic light emitting diode (OLED) display technology has promoted the rapid entry of curved surface and flexible display products into the market in recent years. The technological update in related fields is also changing with each passing day. OLED refers to a diode that emits light by carrier injection and recombination under the electric field driven by an organic semiconductor material and a luminescent material. The OLED display device has wider application range due to its advantages of light weight, self-illumination, wide viewing angle, low driving voltage, high luminous efficiency, low power consumption, and fast response speed. In an OLED pixel circuit, OLED illumination in a pixel circuit can be driven by a thin film transistor (TFT), which is called a driving transistor. The brightness of the OLED is related to the current flowing through the OLED so the electrical performance of the TFT as the driving transistor directly affects the display effect. Especially, a threshold voltage of the TFT often drifts. The stability is degraded after the bias is turned on for a long time. The drift of the driving current is produced. The brightness of the entire OLED display device is uneven. To improve the display effect of the OLED display device, pixel compensation is generally performed on the OLED to eliminate the influence of OLED drive current drift (i.e., the threshold shift of the driving transistor), which is called a pixel compensation circuit.

An active-matrix organic light emitting diode (AMO-LED) display device is a display device where an OLED device is driven with the current to emit light to form an image. To obtain better picture with uniformity, more accurate current control capability is required. Therefore, both external compensation and internal compensation are generally configured to achieve the above-mentioned effects. Internal compensation means that each subpixel adopts a pixel compensation circuit, such as 7T1C (a structure of seven TFTs plus one storage capacitor), a 6T1C (a structure of six TFTs plus one storage capacitor), and a 6T2C (a structure of six TFTs plus two storage capacitors), to control and regulate an output current through the driving transistor.

Figure 1A:
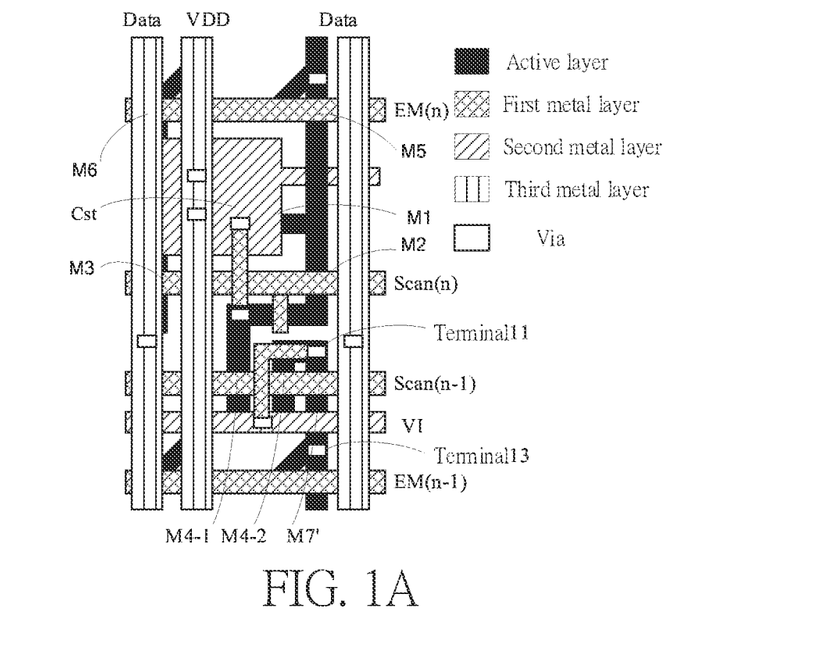
FIG. 1A is a schematic diagram of a pixel structure including a pixel compensation circuit of the related art.
Figure 1B:
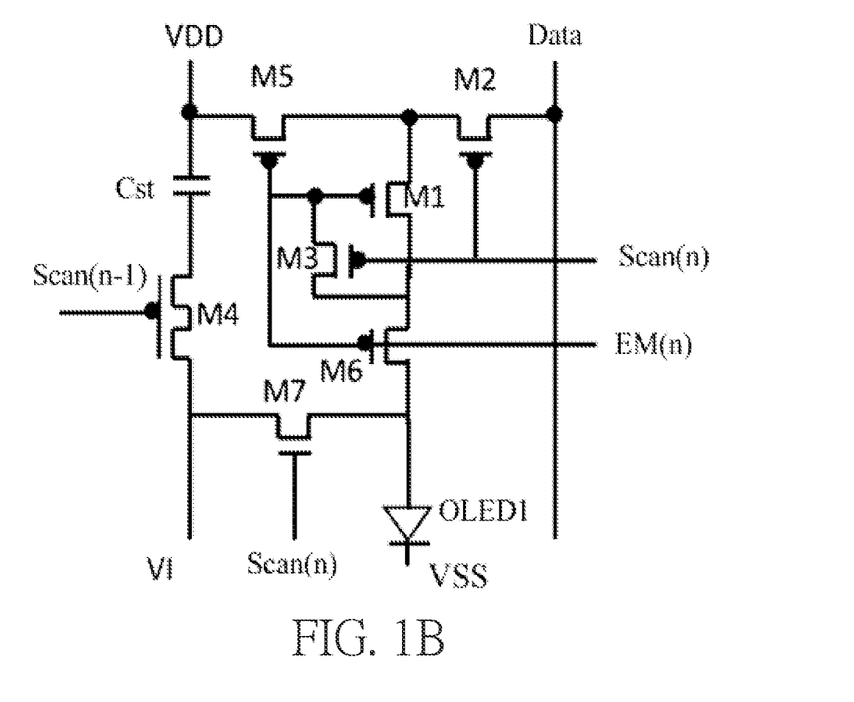
FIG. 1B is a circuit schematic diagram of the pixel compensation circuit as illustrated FIG. 1A.

Please refer to FIG. 1A and FIG. 1B. FIG. 1A is a schematic diagram of a pixel structure including a pixel compensation circuit of the related art. FIG. 1B is a circuit schematic diagram of the pixel compensation circuit as illustrated FIG. 1A. The pixel compensation circuit is a 7T1C circuit, including first to seventh transistors M1-M7, a storage capacitor Cst, and an organic light-emitting diode (OLED) OELD1.

In FIG. 1A, a first metal layer includes a scanning signal line (Scan), a light emission control signal line (EM), and a lower plate of the storage capacitor Cst. A second metal layer includes an upper plate of the storage capacitor Cst and a voltage signal line VI. A third metal layer includes a driving voltage signal line VDD and a data signal line Data. In FIG. 1A, reference numeral M7' indicates that the seventh transistor M7' is controlled by a scanning signal line Scan (n−1) in a previous row. The seventh transistor M7' is a transistor in another 7T1C circuit unit. The transistors M1-M6 for the same 7T1C circuit are controlled by the scanning signal line Scan(n). The seventh transistor M7 for the same 7T1C circuit unit is controlled by the scanning signal line Scan(n) (not illustrated in FIG. 1A) as well.

In FIG. 1B, a gate of the first transistor M1, a gate of fifth transistor M5, and a gate of sixth transistor M6 are all connected to the light emission control signal line EM(n) in an nth row. A gate of the second transistor M2, a gate of the third transistor M3, and a gate of the seventh transistor M7 are all connected to the scanning signal line Scan(n) in the nth row. The fourth transistor M4 is a TFT of a double-gate structure (including M4-1 and M4-2 portions). The gate of the fourth transistor M4 is connected to the scanning signal line Scan(n−1) in the (n−1)th row. A source of the second transistor M2 and a source of the fifth transistor M5 are both connected to a drain of the first transistor M1. A source of the first transistor M1 and a source of the third transistor M3 are both connected to a drain of the sixth transistor M6. A drain of the third transistor M3 is connected to the light emission control signal lines EM(n) in the nth row. A drain of the second transistor M2 is connected to the data signal line Data. A drain of the fifth transistor M5 is connected to the driving voltage signal line VDD (usually at a high level), and is electrically connected to the upper plate of the storage capacitor Cst. A source of the fourth transistor M4 is electrically connected to the lower plate of the storage capacitor Cst. A drain of the fourth transistor M4 and a drain of the seventh transistor M7 are both connected to the reset voltage signal line VI. A source of the sixth transistor M6 and a source of the seventh transistor M7 are both connected to the anode of the OLED OLED1. A cathode of the OLED OLED1 is connected to a common ground voltage signal line VSS (typically at a low level).

The fourth transistor M4 and the seventh transistor M7 are controlled by different scanning signal lines. When the scanning signal line Scan(n−1) in the (n−1)th row outputs a scanning signal, the fourth transistor M4 is turned on. Thereby, the lower plate of the storage capacitor Cst is connected to a reset voltage signal line VI and is reset after receiving the reset voltage signal. When the scan signal signal Scan(n) in the nth row outputs a scanning signal, the seventh transistor M7 is turned on. Thereby, the anode of the OLED OLED1 is connected to the reset voltage signal line VI to be reset after receiving the reset voltage signal.

However, the source of the fourth transistor M4 (like the terminal 12 illustrated in FIG. 1A) is electrically connected to the lower plate of the storage capacitor Cst. The drain (like the terminal 11 illustrated in FIG. 1A) is electrically connected to the reset voltage signal line VI. The drain of the seventh transistor M7' in another 7T1C circuit unit (like the terminal 11 illustrated in FIG. 1A) is electrically connected to the reset voltage signal line VI. The source (like the terminal 13 illustrated in FIG. 1A) is connected to the anode of the OLED OLED1. Since the fourth transistor M4 or the seventh transistor M7 (same structure as the seventh transistor M7' in the other 7T1C circuit unit) has one or more TFT of a double-gate structure (for example, the fourth transistor M4 is double in FIG. 1A is a TFT of a double-gate structure, including the M4-1 and M4-2 portions). Moreover, the fourth transistor M4 and the seventh transistor M7' are arranged at both sides of the terminal 11, respectively, causing polysilicon (Poly) for the active layers of the two TFTs to be S-shaped traces after 90 degree rotation (i.e., three polysilicon traces in the vertical direction). Due to the layout of components in pixel compensation circuits such as 7T1C, 6T1C, and 6T2C, the size of the pixel structure is further reduced, which limits the increase in pixels per inch (PPI).

SUMMARY OF THE INVENTION

An object of the present disclosure is to provide a pixel compensation circuit and an organic light-emitting diode (OLED) display device to deal with the problems of the related art as mentioned above. The adoption of the pixel compensation circuit and the OLED display device is good for reducing the space of the pixel structure, increase the pixel density, and facilitate the design of a panel with high pixels per inch (PPI).

According to a first aspect of the present disclosure, a pixel compensation circuit applied to a pixel structure is provided. The pixel structure comprises a reset voltage signal line, a driving voltage signal line, a common ground voltage signal line, and n scanning signal lines; n being a positive integer greater than one; wherein the pixel compensation circuit comprises a fourth transistor, a seventh transistor, a storage capacitor, and an organic light emitting diode (OLED); the fourth transistor, the seventh transistor, the storage capacitor, and the OLED are controlled by the same scanning signal line; meanwhile, the fourth transistor and the seventh transistor are both connected to the reset voltage signal line; a gate of the fourth transistor and a gate of the seventh transistor are both connected to a scanning signal line in an (n−1)th row; a drain of the fourth transistor is connected to the reset voltage signal line; a source of the fourth transistor is electrically connected to a lower plate of the storage capacitor; an upper plate of the storage capacitor is connected to the driving voltage signal line; a drain of the seventh transistor is connected to the reset voltage signal line; a source of the seventh transistor is electrically connected to an anode of the OLED, and a cathode of the OLED is connected to the common ground voltage signal line; one or more of the fourth transistor and the seventh transistor is a double-gate transistor or a multi-gate transistor; the fourth transistor and the seventh transistor share one or more portion of an active layer; the fourth transistor is connected to a polysilicon trace for the active layer of the seventh transistor; the polysilicon trace is two traces in a vertical direction; the vertical direction is defined as the trace of the reset voltage signal line extending in a vertical direction.

According to a second aspect of the present disclosure, a pixel compensation circuit, applied to a pixel structure; the pixel structure comprising a reset voltage signal line and a plurality of scanning signal lines; wherein the pixel compensation circuit comprises a fourth transistor and a seventh transistor controlled by the same scanning signal line; meanwhile, the fourth transistor and the seventh transistor are both connected to the reset voltage signal line; the fourth transistor is connected to a polysilicon trace for an active layer of the seventh transistor; the polysilicon trace is two traces in a vertical direction; the vertical direction is defined as the trace of the reset voltage signal line extending in a vertical direction.

According to a third aspect of the present disclosure, an organic light emitting diode (OLED) display device comprises: a pixel structure comprising a reset voltage signal line and a plurality of scanning signal lines; a pixel compensation circuit, applied to the pixel structure; wherein the pixel compensation circuit comprises a fourth transistor and a seventh transistor controlled by the same scanning signal line; meanwhile, the fourth transistor and the seventh transistor are both connected to the reset voltage signal line; the fourth transistor is connected to a polysilicon trace for an active layer of the seventh transistor; the polysilicon trace is two traces in a vertical direction; the vertical direction is defined as the trace of the reset voltage signal line extending in a vertical direction.

The advantage of the present disclosure is as follows: Two or more TFTs are controlled by the scanning signal output from the scanning signal line in the same row in the pixel compensation circuit proposed by the present disclosure. Further, the OLED and the storage capacitor are both connected to the reset voltage signal line. So the OLED and the storage capacitor are reset after receiving the reset voltage signal. Each of the TFTs is of a single-gate structure. Or, one or more of the TFTs is of a double-gate or a multi-gate structure. The TFTs share one or more portion of the active layer. At the same time, the polysilicon traces for the active layers of the two TFTs are only two in the vertical direction, thereby compressing the size of the pixel structure in the horizontal direction, providing space for the improvement of the PPI, and facilitating the design a panel with high PPI.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art.

It should further be understood that, although the terms first, second, third, and the like may be used herein to describe various elements, components, regions, layers and/or sections, these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The pixel compensation circuit is applied to a pixel structure. The pixel structure includes a reset voltage signal line and a plurality of scanning signal lines. The Pixel compensation circuit includes a fourth transistor and a seventh transistor which are both controlled by the same scanning signal line. The seventh transistor is connected to a reset voltage signal line. A polysilicon trace for an active layer of the fourth transistor is connected to a polysilicon trace for an active layer of the seventh transistor. The polysilicon traces are two traces in the vertical direction. The vertical direction is defined as the direction of the reset voltage signal line traces extending direction perpendicular to the definition of the reset voltage signal line traces extending direction of the horizontal direction. Since the polysilicon active layer of the two transistors traces in the vertical direction is 2 traces, which can reduce the size of the pixel structure in the horizontal direction, providing space for the pixel density (PPI) and helping to improve the pixel density, high pixel density panel design.

Specifically, each of the TFTs is of a single-gate structure. Or, one or more of the TFTs is of a double-gate or a multi-gate structure (i.e., including two and more non-continuous active layers). The TFTs share one or more portion of the active layer.

Figure 2A:
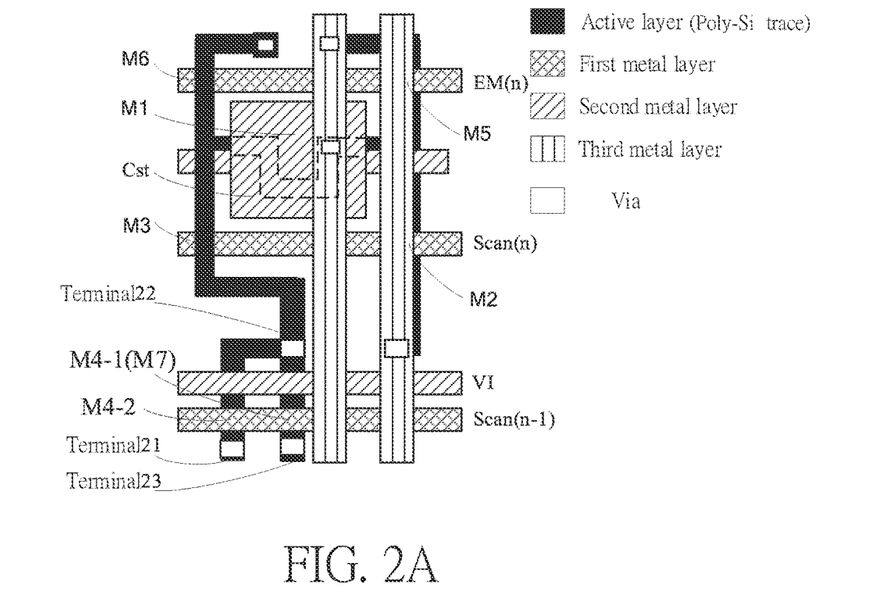
FIG. 2A is a schematic diagram of a pixel structure of an embodiment of a pixel compensation circuit of the present disclosure.
Figure 2B:
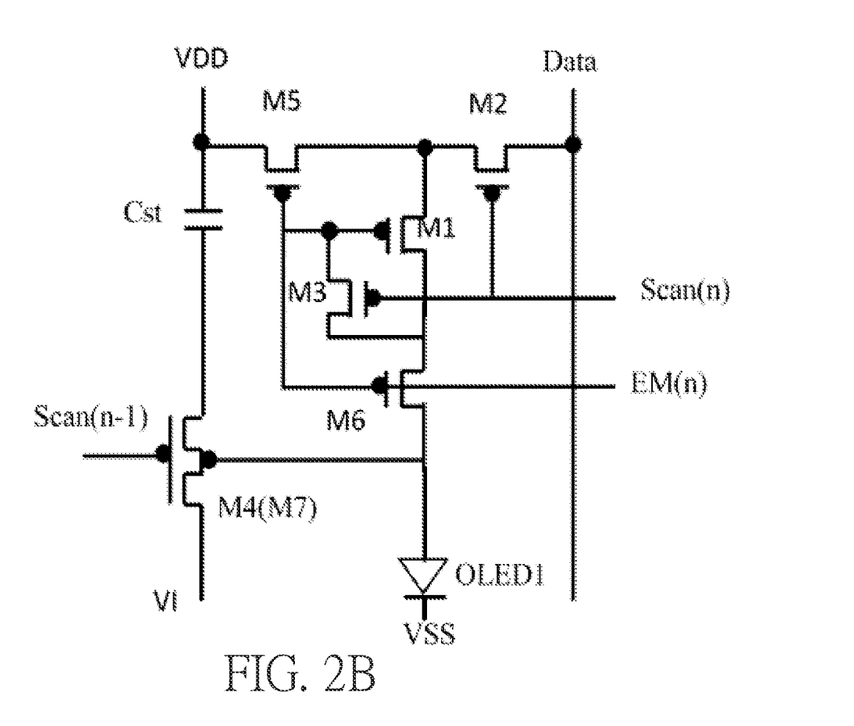
FIG. 2B is a circuit schematic diagram of a pixel compensation circuit as illustrated in FIG. 2A.

Please refer to FIG. 2A to FIG. 2B. FIG. 2A is a schematic diagram of a pixel structure of an embodiment of a pixel compensation circuit of the present disclosure. FIG. 2B is a circuit schematic diagram of a pixel compensation circuit as illustrated in FIG. 2A. The positions of the transistors are relative illustrated in the figures. In fact, the active layer is arranged below the other metal layers of the pixel structure film layer. The pixel compensation circuit in the present embodiment is a 7T1C circuit including first to seventh thin film transistors (TFTs) M1-M71, a storage capacitor Cst, and an organic light emitting diode (OLED) OELD1. A pixel compensation circuit in another embodiment is a circuit like 6T1C circuit, a 6T2C circuit, etc. In FIG. 2A, the first metal layer includes a plurality of scanning signal lines (Scan), a plurality of light emission control signal lines (EM), and a lower plate of one or more storage capacitor Cst. The second metal layer includes an upper plate of the storage capacitor Cst and a voltage signal line VI. The third metal layer includes a driving voltage signal line VDD and a plurality of data signal lines Data.

In the present embodiment, the fourth transistor M4 is a TFT of a double-gate structure and includes the M4-1 and M4-2 portions in the present embodiment. Specifically, the gate of the fourth transistor M4 and the gate of the seventh transistor M7 are both connected to the scanning signal line Scan(n−1) in the (n−1)th row. N is a positive integer greater than one. The source of the M4-2 portion of the fourth transistor M4 is connected to the lower plate of the storage capacitor Cst (connected through the terminal 21 illustrated in FIG. 2A). The upper plate of the storage capacitor Cst is connected to the driving voltage signal line VDD. The M4-1 portion of the fourth transistor M4 and the seventh transistor M7 share the active layer. One terminal of each of the transistors is connected to the reset voltage signal line VI (connected through the terminal 23 illustrated in FIG. 2A). The other terminal of each of the transistors is electrically connected to the anode of the OLED OLED1 (electrically connected through the terminal 22 illustrated in FIG. 2A). The cathode of the OLED OLED1 is connected to a common ground voltage signal line VSS. In other words, there is a TFT (the M4-2 portion of the fourth transistor M4 in the present embodiment) between the reset voltage signal line VI and the lower plate of the storage capacitor Cst. One or more TFT is arranged between the reset voltage signal line VI and the anode of the OLED OLED1 (the M4-1 portion of the fourth transistor M4 and the seventh transistor M7 in the present embodiment). The lower plate of the storage capacitor Cst and the anode of the OLED OLED1 are both coupled to the reset voltage signal line VI.

The fourth transistor M4 and the seventh transistor M7 are both controlled by the scanning signal of the previous frame image outputted through the scanning signal line Scan (n−1) in the (n−1)th row. When the scanning signal is output through the scanning signal line Scan(n−1) in the (n−1)th row outputs the scanning signal, the fourth transistor M4 and the seventh transistor M7 are both simultaneously turned on, thereby connecting the anode of the OLED OLED1 with the reset voltage signal line VI and resetting the anode of the OLED OLED1 by receiving a reset voltage signal. Because the fourth transistor M4 is turned on, the lower plate of the storage capacitor Cst is connected to the reset voltage signal line VI, and then the fourth transistor M4 receives a reset voltage signal and reset.

The gate of the first transistor M1, the gate of the fifth transistor M5, and the gate of the sixth transistor M6 are all connected to the light emission control signal line EM(n) in the nth row. The gate of the second transistor M2 and the gate of the third transistor M3 are both connected to the scanning signal line Scan(n) in the nth row. The source of the second transistor M2 and the source of the fifth transistor M5 are both connected to the drain of the first transistor M1. The source of the first transistor M1 and the source of the third transistor M3 are both connected to the drain of the sixth transistor M6. The drain of the second transistor M2 is connected to the data signal line Data. The drain of the third transistor M3 is connected to the light emission control signal line EM(n) in the nth row. The drain of the fifth transistor M5 is connected to the driving voltage signal line VDD. The source of the sixth transistor M6 is electrically connected to the anode of the OLED OLED1.

In the 7T1C circuit of the present disclosure, two or more TFTs controlled by the scan signals of the previous frame picture outputted by the (n−1)th scanning signal line Scan (n−1), for example, the fourth transistor M4 and the seventh transistor M7. Each of the TFTs may be of a single-gate structure. Or, one or more of the TFTs is of a double-gate or a multi-gate structure (i.e., including two and more non-continuous active layers). Meanwhile, the TFTs share one or more portion of the active layer. The scanning signal line Scan(n−1) in the (n−1)th row and the reset voltage signal line VI extend in the same direction (that is, in parallel). The active layers of the four transistors M4 and the seventh transistor M7 may be formed with a semiconductor material in the same layer.

The fourth transistor M4 and the seventh transistor M7 are arranged at the terminal 21 and are controlled by the scanning signals. The polysilicon traces for the active layers of the fourth transistor M4 and the seventh transistor M7 are connected. In the vertical direction, there may be only two traces and the size of the pixel structure in the horizontal direction may be compressed, which provides space for the improvement of the PPI, and is advantageous for designing the PPI panel better. The direction in which the trace of the reset voltage signal line VI is defined is the horizontal direction. The direction perpendicular to the direction in which the trace of the reset voltage signal line VI extends is the vertical direction.

The first transistor to the seventh transistor M1-M7 are all p-channel metal-oxide semiconductor (PMOS) transistors or all n-channel metal-oxide semiconductor (NMOS) transistors in the pixel compensation circuit proposed by the present disclosure.

Figure 3:
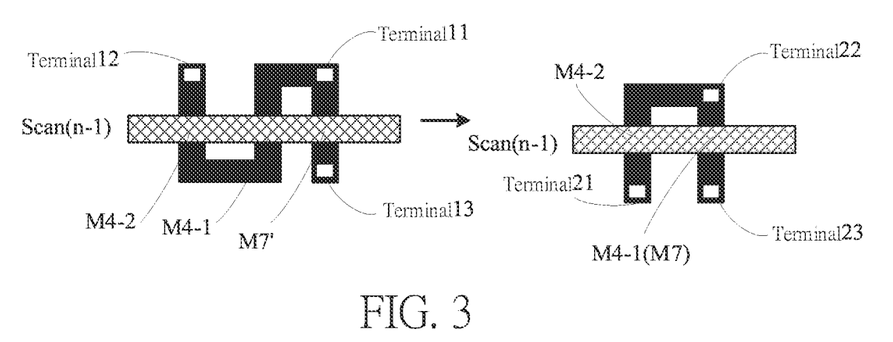
FIG. 3 illustrates a schematic diagram of the pixel compensation circuit of the present disclosure.

Please refer to FIG. 3 illustrating a schematic diagram of the pixel compensation circuit of the present disclosure. The pixel compensation circuit of the present disclosure is partially illustrated on the right side of FIG. 3. The pixel compensation circuit in the related art is partially illustrated on the left side of FIG. 3. The scanning signal line Scan(n−1) in the (n−1)th row is parallel to the reset voltage signal line VI. Only the scanning signal line Scan(n−1) in the (n−1)th row is illustrated in FIG. 3.

In the pixel compensation circuit proposed by the present disclosure, the fourth transistor M4 and the seventh transistor M7 may both be controlled by scanning signals output from the scanning signal lines in the same row. Thereby, the OLED and the storage capacitor are connected to the reset voltage signal line, and are reset by receiving the reset voltage signal. At the same time, the polysilicon traces for the active layers of the fourth transistor M4 and the seventh transistor M7 are connected (through holes at the terminals), and may be only two traces in the vertical direction so that the pixel structure can be compressed. The horizontal dimension provides space for the PPI to improve and design the PPI panel better. The fourth transistor M4 and the seventh transistor M7, which are controlled by the scanning signal in the same row, may be a TFT of a single-gate structure each. Alternatively, one or more of the fourth transistor M4 and the seventh transistor M7 is a transistor of a double-gate or a multi-gate transistor (i.e., including two or more discontinuous active layers separated by holes). The fourth transistor M4 and the seventh transistor M7 share one or more portion of the active layer. For example, the fourth transistor M4 on the right side is of a double-gate structure including the M4-1 and M4-2 portions in FIG. 3. The seventh transistor M7 is of a single-gate structure. The M4-1 portion of the fourth transistor M4 shares the active layer with the seventh transistor M7.

The fourth transistor M4 and the seventh transistor M7 in the same pixel compensation circuit are controlled by the scanning signals in two rows, respectively, in the pixel compensation circuit of the related art. One or more of the fourth transistor M4 and the seventh transistor M7' of the other pixel compensation circuit controlled by the same row of scanning signals is a TFT of a double-gate structure (for example, the fourth transistor M4 on the left side of FIG. 3 is a TFT of a double-gate structure and includes the M4-1 and M4-2 portions.). The TFTs do not share the active layer, resulting in the S-shaped polysilicon trace in the active layer after 90 degree rotation (i.e., three polysilicon traces in the vertical direction, which limits the increase of the pixel density).

Compared with the related art, two or more TFTs are controlled by the scanning signal output from the scanning signal line in the same row in the pixel compensation circuit proposed by the present disclosure. Further, the OLED and the storage capacitor are both connected to the reset voltage signal line. So the OLED and the storage capacitor are reset after receiving the reset voltage signal. The size of the pixel structure in the horizontal direction is compressed in the pixel compensation circuit of the present disclosure, thereby providing space for the improvement of the PPI and facilitating the design of the high PPI panel successfully.

The present disclosure also provides an OLED display device based on similar inventive concept. The OLED display device includes a pixel structure and the pixel compensation circuit as disclosed in the above embodiments. According to the pixel compensation circuit, two or more TFTs are controlled by the scanning signal output from the scanning signal line in the same row in the pixel compensation circuit proposed by the present disclosure. Further, the OLED and the storage capacitor are both connected to the reset voltage signal line. So the OLED and the storage capacitor are reset after receiving the reset voltage signal. The size of the pixel structure in the horizontal direction is compressed in the pixel compensation circuit of the present disclosure, thereby providing space for the improvement of the PPI and facilitating the design of the high PPI panel successfully.

INDUSTRIAL APPLICABILITY

The subject matter of the present disclosure can be manufactured and used in an industry, thereby meeting industrial applicability.

What is claimed is:

1. A pixel compensation circuit, applied to a pixel structure; the pixel structure comprising a reset voltage signal line, a driving voltage signal line, a common ground voltage signal line, and n scanning signal lines; n being a positive integer greater than one; wherein the pixel compensation circuit comprises a fourth transistor, a seventh transistor, a storage capacitor, and an organic light emitting diode (OLED);

the fourth transistor, the seventh transistor, the storage capacitor, and the OLED are controlled by the same scanning signal line; the fourth transistor and the seventh transistor are both connected to the reset voltage signal line;

a gate of the fourth transistor and a gate of the seventh transistor are both connected to a scanning signal line in an (n−1)th row;

a drain of the fourth transistor is connected to the reset voltage signal line; a source of the fourth transistor is electrically connected to a lower plate of the storage capacitor; an upper plate of the storage capacitor is connected to the driving voltage signal line;

a drain of the seventh transistor is connected to the reset voltage signal line; a source of the seventh transistor is electrically connected to an anode of the OLED, and a cathode of the OLED is connected to a constant low voltage;

one or more of the fourth transistor and the seventh transistor is a double-gate transistor or a multi-gate transistor; the fourth transistor and the seventh transistor share one or more portion of an active layer;

the drain or source of the fourth transistor is connected to a polysilicon trace for the active layer of the seventh transistor; the polysilicon trace comprises two traces perpendicular to the reset voltage signal line.

2. The pixel compensation circuit of claim 1, wherein the scanning signal line and the reset voltage signal line extend in the same direction.

3. The pixel compensation circuit of claim 1, wherein the active layer of the fourth transistor and the active layer of the seventh transistor are formed using the same layer of semiconductor material.

4. The pixel compensation circuit of claim 1, wherein the pixel structure further comprises a plurality of light emission control signal lines; the pixel compensation circuit further comprises a first transistor, a second transistor, a third transistor, a fifth transistor, and a sixth transistor;

a gate of the first transistor, a gate of the fifth transistor, and a gate of the sixth transistor are all connected to a light emission control signal line in an nth row; a gate of the second transistor and a gate of the third transistor are both connected to a scanning signal line in an nth row;

a source of the second transistor and a source of the fifth transistor are both connected to drain of the first transistor; a source of the first transistor and a source of the third transistor are both connected to drain of the sixth transistor;

drain of the second transistor is connected to a data signal line;

drain of the third transistor is connected to the light emission control signal line in the nth row;

drain of the fifth transistor is connected to the driving voltage signal line;

a source of the sixth transistor is electrically connected to the anode of the OLED.

5. A pixel compensation circuit, applied to a pixel structure; the pixel structure comprising a reset voltage signal line and a plurality of scanning signal lines; wherein the pixel compensation circuit comprises a fourth transistor and a seventh transistor controlled by the same scanning signal line; the fourth transistor and the seventh transistor are both connected to the reset voltage signal line;

the fourth transistor is connected to a polysilicon trace for an active layer of the seventh transistor; the polysilicon trace comprises:

a first trace, extended in a vertical direction; and a second trace, having a first section and a second section that is parallel to the first trace and is perpendicular to the first section;

wherein the vertical direction is defined as a direction perpendicular to an extending direction of the trace of the reset voltage signal line.

6. The pixel compensation circuit of claim 5, wherein the scanning signal line and the reset voltage signal line extend in the same direction.

7. The pixel compensation circuit of claim 5, wherein one or more of the fourth transistor and the seventh transistor is a double-gate transistor or a multi-gate transistor; the fourth transistor and the seventh transistor share one or more portion of the active layer.

8. The pixel compensation circuit of claim 5, wherein the active layer of the fourth transistor and the active layer of the seventh transistor are formed using the same layer of semiconductor material.

9. The pixel compensation circuit of claim 5, wherein the pixel compensation circuit further comprises a storage capacitor and an organic light emitting diode (OLED);

a gate of the fourth transistor and a gate of the seventh transistor are both connected to a scanning signal line in an (n−1)th row; n is a positive integer greater than one;

drain of the fourth transistor is connected to the reset voltage signal line; a source of the fourth transistor is connected to a lower plate of the storage capacitor; an upper plate of the storage capacitor is connected to a driving voltage signal line;

drain of the seventh transistor is connected to the reset voltage signal line, a source electrically is connected to an anode of the OLED, a cathode of the OLED is connected to a constant low voltage.

10. The pixel compensation circuit of claim 9, wherein the pixel structure further comprises a plurality of light emission control signal lines; the pixel compensation circuit further comprises a first transistor, a second transistor, a third transistor, a fifth transistor, and a sixth transistor;

a gate of the first transistor, a gate of the fifth transistor, and a gate of the sixth transistor are all connected to a light emission control signal line in an nth row; a gate of the second transistor and a gate of the third transistor are both connected to a scanning signal line in an nth row;

a source of the second transistor and a source of the fifth transistor are both connected to drain of the first transistor; a source of the first transistor and a source of the third transistor are both connected to drain of the sixth transistor;

drain of the second transistor is connected to a data signal line;

drain of the third transistor is connected to the light emission control signal line in the nth row;

drain of the fifth transistor is connected to the driving voltage signal line;

a source of the sixth transistor is electrically connected to the anode of the OLED.

11. An organic light emitting diode (OLED) display device, comprising:

a pixel structure comprising a reset voltage signal line and a plurality of scanning signal lines;

a pixel compensation circuit, applied to the pixel structure; wherein the pixel compensation circuit comprises a fourth transistor and a seventh transistor controlled by the same scanning signal line; the fourth transistor and the seventh transistor are both connected to the reset voltage signal line;

the fourth transistor is connected to a polysilicon trace for an active layer of the seventh transistor; the polysilicon trace comprises;

a first trace, extended in a vertical direction; and a second trace, having a first section and a second section that is parallel to the first trace and is perpendicular to the first section;

wherein the vertical direction is defined as a direction perpendicular to an extending direction of the trace of the reset voltage signal line.

12. The OLED display device of claim 11, wherein the scanning signal line and the reset voltage signal line extend in the same direction.

13. The OLED display device of claim 11, wherein one or more of the fourth transistor and the seventh transistor is a double-gate transistor or a multi-gate transistor; the fourth transistor and the seventh transistor share one or more portion of the active layer.

14. The OLED display device of claim 11, wherein the active layer of the fourth transistor and the active layer of the seventh transistor are formed using the same layer of semiconductor material.

15. The OLED display device of claim 11, wherein the pixel compensation circuit further comprises a storage capacitor and an organic light emitting diode (OLED);
   a gate of the fourth transistor and a gate of the seventh transistor are both connected to a scanning signal line in an (n−1)th row; n is a positive integer greater than one;
   drain of the fourth transistor is connected to the reset voltage signal line; a source of the fourth transistor is connected to a lower plate of the storage capacitor; an upper plate of the storage capacitor is connected to a driving voltage signal line;
   drain of the seventh transistor is connected to the reset voltage signal line, a source electrically is connected to an anode of the OLED, a cathode of the OLED is connected to a constant low voltage.

16. The OLED display device of claim 15, wherein the pixel structure further comprises a plurality of light emission control signal lines; the pixel compensation circuit further comprises a first transistor, a second transistor, a third transistor, a fifth transistor, and a sixth transistor;
   a gate of the first transistor, a gate of the fifth transistor, and a gate of the sixth transistor are all connected to a light emission control signal line in an nth row; a gate of the second transistor and a gate of the third transistor are both connected to a scanning signal line in an nth row;
   a source of the second transistor and a source of the fifth transistor are both connected to drain of the first transistor; a source of the first transistor and a source of the third transistor are both connected to drain of the sixth transistor;
   drain of the second transistor is connected to a data signal line;
   drain of the third transistor is connected to the light emission control signal line in the nth row;
   drain of the fifth transistor is connected to the driving voltage signal line;
   a source of the sixth transistor is electrically connected to the anode of the OLED.

* * * * *

UNITED STATES PATENT AND TRADEMARK OFFICE
CERTIFICATE OF CORRECTION

PATENT NO. : 10,984,724 B2
APPLICATION NO. : 16/603857
DATED : April 20, 2021
INVENTOR(S) : Wei Wang et al.

Page 1 of 1

It is certified that error appears in the above-identified patent and that said Letters Patent is hereby corrected as shown below:

On the Title Page

Insert the following:
Item (30) Foreign Application Priority Data
--May 14, 2019 (CN)....................201910396424.7--

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*